United States Patent
Matsuda

(10) Patent No.: US 9,136,148 B2
(45) Date of Patent: Sep. 15, 2015

(54) SUBSTRATE PROCESSING APPARATUS, CONTROL DEVICE THEREOF, AND CONTROL METHOD THEREOF

(75) Inventor: Kazuhisa Matsuda, Oshu (JP)

(73) Assignee: Tokyo Electron Limited, Minato-Ku (JP)

(*) Notice: Subject to any disclaimer, the term of this patent is extended or adjusted under 35 U.S.C. 154(b) by 456 days.

(21) Appl. No.: 13/112,194

(22) Filed: May 20, 2011

(65) Prior Publication Data

US 2011/0287172 A1 Nov. 24, 2011

(30) Foreign Application Priority Data

May 20, 2010 (JP) .................................. 2010-116481

(51) Int. Cl.
 C23C 16/00 (2006.01)
 H01L 21/67 (2006.01)
 C23C 16/455 (2006.01)
 C23C 16/52 (2006.01)
(52) U.S. Cl.
 CPC .... H01L 21/67253 (2013.01); C23C 16/45546 (2013.01); C23C 16/45548 (2013.01); C23C 16/52 (2013.01)
(58) Field of Classification Search
 CPC .................................................. C23C 16/45546
 USPC ................ 118/695–706; 156/345.24–345.29; 700/117–125
 See application file for complete search history.

(56) References Cited

U.S. PATENT DOCUMENTS

| | | | | |
|---|---|---|---|---|
| 4,430,959 A | * | 2/1984 | Ebata et al. ..................... | 118/697 |
| 6,061,640 A | * | 5/2000 | Tanaka et al. ................. | 700/121 |
| 6,641,746 B2 | * | 11/2003 | Houge et al. .................... | 216/59 |
| 7,139,632 B2 | * | 11/2006 | Cooperberg et al. ......... | 700/121 |
| 7,507,676 B2 | * | 3/2009 | Chou et al. .................... | 438/758 |
| 7,950,348 B2 | | 5/2011 | Sakai et al. | |
| 2001/0007244 A1 | * | 7/2001 | Matsuse ........................ | 118/719 |

(Continued)

FOREIGN PATENT DOCUMENTS

CN 1812048 A 8/2006
CN 1842899 A 10/2006

(Continued)

OTHER PUBLICATIONS

Chinese Office Action, Chinese Application No. 201110132217.4, dated Dec. 30, 2013 (12 pages).

(Continued)

Primary Examiner — Gordon R Baldwin
Assistant Examiner — Charlee Bennett
(74) Attorney, Agent, or Firm — Burr & Brown, PLLC

(57) ABSTRACT

A process gas supply cycle pattern that will adversely affect the result of processing is changed beforehand. Based on information supplied from a setting input section, a pattern computation section obtains the result of computation of a process gas supply cycle pattern that includes a rotation cycle of a substrate rotation mechanism, a supply cycle of a process gas, a supply time of the process gas, and a supply count of the process gas. Based on information supplied from the setting input section, a simulator simulates the shape of a supply region of the process gas to be supplied onto a substrate. A comparison section compares the result of computation of the process gas supply cycle pattern determined by the pattern computation section against the result of referencing of a process gas supply cycle pattern that adversely affects the result of processing and is obtained from a storage section.

13 Claims, 7 Drawing Sheets

(56) References Cited

U.S. PATENT DOCUMENTS

| | | |
|---|---|---|
| 2006/0150905 A1 | 7/2006 | Sakai et al. |
| 2008/0153309 A1 | 6/2008 | Sakai et al. |
| 2008/0160214 A1 | 7/2008 | Sakai et al. |
| 2011/0272098 A1* | 11/2011 | Nonomura ............... 156/345.26 |

FOREIGN PATENT DOCUMENTS

| | | |
|---|---|---|
| JP | 2003-100574 | 4/2003 |
| JP | 2004-134466 A1 | 4/2004 |
| JP | 2009-239304 A1 | 10/2009 |
| JP | 2009-260159 | 11/2009 |
| WO | 2005/088692 | 9/2005 |

OTHER PUBLICATIONS

Japanese Office Action, dated Jan. 7, 2014 (3 pages).
Japanese Office Action (Application No. 2010-116481) dated Sep. 12, 2014.

* cited by examiner

SUBSTRATE PROCESSING APPARATUS, CONTROL DEVICE THEREOF, AND CONTROL METHOD THEREOF

CROSS-REFERENCE TO RELATED APPLICATION

This application claims the benefit of Japanese Patent Application No. 2010-116481 filed on May 20, 2010, the entire contents of which being incorporated herein by reference.

BACKGROUND OF THE INVENTION

1. Field of the Invention

The present invention relates to a substrate processing apparatus, a control device thereof, and a control method thereof, and more particularly to a control device and a control method that provide improved in-plane uniformity during substrate processing.

2. Description of the Related Art

CVD and other substrate processing apparatuses have been conventionally used to form a film on a substrate by supplying a process gas onto the substrate. In such an instance, as the process gas is supplied continuously for a predetermined period of time while the substrate rotates, the rotation cycle of the substrate rarely affects in-plane uniformity during substrate processing.

In recent years, however, there has been an increasing demand for miniaturizing the film on the substrate so that the process gas is supplied intermittently for a short period of time. In this case, it is found that the relationship between the rotation cycle of the substrate and the supply cycle of the process gas affects the in-plane uniformity during substrate processing. The in-plane uniformity is particularly affected during a process to which an atomic layer deposition method (ALD method) is applied.

RELATED ART LITERATURE

Patent Document

Patent Document 1: JP-A-2009-239304

SUMMARY OF THE INVENTION

The present invention has been made in view of the above circumstances, and provides a substrate processing apparatus, a control device thereof, and a control method thereof, which can provide improved in-plane uniformity by controlling the rotation cycle of a substrate and the supply cycle of a process gas in consideration of the fact that the substrate rotation cycle and process gas supply cycle may affect the in-plane uniformity during substrate processing.

According to a first aspect of the present invention, there is provided a substrate processing apparatus including a substrate processing chamber that houses and processes at least one substrate; a substrate rotation mechanism that rotatably retains the substrate in the substrate processing chamber; a process gas supply section that supplies a process gas to the substrate in the substrate processing chamber; and a control device that controls the substrate rotation mechanism and the process gas supply section. The control device includes a setting input section that inputs a rotation speed setting P for the substrate rotation mechanism, a supply cycle setting Q, a supply time setting R, and a supply count setting S for the process gas to be supplied from the process gas supply section, and a pattern computation section that, in accordance with information supplied from the setting input section, obtains the result of computation of a process gas supply cycle pattern that includes a rotation cycle of the substrate rotation mechanism, and a supply cycle, a supply time, and a supply count of the process gas.

According to a second aspect of the present invention, there is provided the substrate processing apparatus as described in the first aspect, wherein the control device further includes a simulator that, in accordance with the information supplied from the setting input section, simulates the shape of a supply region of the process gas to be supplied onto the substrate. The result of the simulation performed by the simulator is displayed on a display.

According to a third aspect of the present invention, there is provided the substrate processing apparatus as described in the first or second aspect, wherein the control device further includes a storage section that stores the result of referencing of a process gas supply cycle pattern that adversely affects the result of processing; a comparison section that compares the result of computation of the process gas supply cycle pattern determined by the pattern computation section with the result of referencing of the process gas supply cycle pattern from the storage section; and an alarm section that issues an alarm when the comparison section concludes that the result of computation of the process gas supply cycle pattern agrees with the result of referencing of the process gas supply cycle pattern.

According to a fourth aspect of the present invention, there is provided the substrate processing apparatus as described in the first aspect, wherein the control device further includes a change instruction section that instructs the setting input section to change the rotation speed setting P, the supply cycle setting Q, the supply time setting R, or the supply count setting S when a comparison section concludes that the result of computation of the process gas supply cycle pattern agrees with the result of referencing of a process gas supply cycle pattern that adversely affects the result of processing; a teaching section that, when a new process gas supply cycle pattern emerges to adversely affect the result of processing, adds the new process gas supply cycle pattern to the result of referencing of the process gas supply cycle pattern stored in the storage section; and a priority order output section that outputs information to the change instruction section to specify which one of the rotation speed setting P, the supply cycle setting Q, the supply time setting R, and the supply count setting S is to be preferentially changed.

According to a fifth aspect of the present invention, there is provided the substrate processing apparatus as described in the fourth aspect, wherein the priority order output section outputs information to the change instruction section so as to preferentially change the rotation speed setting P or the supply cycle setting Q.

According to a sixth aspect of the present invention, there is provided the substrate processing apparatus as described in the first aspect, wherein the substrate rotation mechanism rotates a susceptor on which one substrate is placed.

According to a seventh aspect of the present invention, there is provided the substrate processing apparatus as described in the first aspect, wherein the substrate rotation mechanism rotates a susceptor on which a plurality of substrates are placed.

According to an eighth aspect of the present invention, there is provided the substrate processing apparatus as described in the first aspect, wherein the substrate rotation mechanism includes a boat rotation mechanism that rotates a boat in which a plurality of substrates are placed.

According to a ninth aspect of the present invention, there is provided the substrate processing apparatus as described in the first aspect, wherein the process gas supply section includes a pair of process gas supply devices that are disposed apart from the outer circumference of the substrate retained by the substrate rotation mechanism, one process gas supply device supplying an A gas, the other process gas supply device supplying a B gas that differs from the A gas.

According to a tenth aspect of the present invention, there is provided a control device for use with a substrate processing apparatus that includes a substrate processing chamber for housing and processing at least one substrate, a substrate rotation mechanism for rotatably retaining the substrate in the substrate processing chamber, and a process gas supply section for supplying a process gas to the substrate in the substrate processing chamber. The control device includes a setting input section that inputs a rotation speed setting P for the substrate rotation mechanism, and a supply cycle setting Q, a supply time setting R, and a supply count setting S for the process gas to be supplied from the process gas supply section; and a pattern computation section that, in accordance with information supplied from the setting input section, obtains the result of computation of a process gas supply cycle pattern that includes a rotation cycle of the substrate rotation mechanism, and a supply cycle, a supply time, and a supply count of the process gas.

According to an eleventh aspect of the present invention, there is provided the control device as described in the tenth aspect, further including a simulator that, in accordance with the information supplied from the setting input section, simulates the shape of a supply region of the process gas to be supplied onto the substrate.

According to a twelfth aspect of the present invention, there is provided a control method for controlling the substrate processing apparatus described in the first aspect. The control method includes the steps of: causing a setting input section to input a rotation speed setting P for a substrate rotation mechanism, and a supply cycle setting Q, a supply time setting R, and a supply count setting S for a process gas to be supplied from a process gas supply section; and, in accordance with information supplied from the setting input section, causing a pattern computation section to compute a process gas supply cycle pattern that includes a rotation cycle of the substrate rotation mechanism, and a supply cycle, a supply time, and a supply count of the process gas.

According to a thirteenth aspect of the present invention, there is provided the control method for the substrate processing apparatus as described in the twelfth aspect. The control method further includes the step of causing a simulator to simulate the shape of a supply region of the process gas to be supplied onto a substrate, and displaying the result of the simulation on a display.

According to the present invention described above, the comparison section compares the result of computation of the process gas supply cycle pattern determined by the pattern computation section against the result of referencing of the process gas supply cycle pattern from the storage section. The alarm section issues an alarm when the comparison section concludes that the results of computation and referencing of the process gas supply cycle pattern agree with each other. This makes it possible to change beforehand a process gas supply cycle pattern that will adversely affect the result of processing. Consequently, the substrate can be properly processed to provide improved in-plane uniformity.

DESCRIPTION OF THE PRESENT INVENTION

First of all, a vertical thermal processing apparatus 20 to which a substrate processing apparatus according to an embodiment of the present invention is applied will be described with reference to FIG. 8. In the vertical thermal processing apparatus shown in FIG. 8, a film is formed on a substrate (wafer) to be processed by a CVD method by supplying a process gas onto the wafer.

Figure 8:
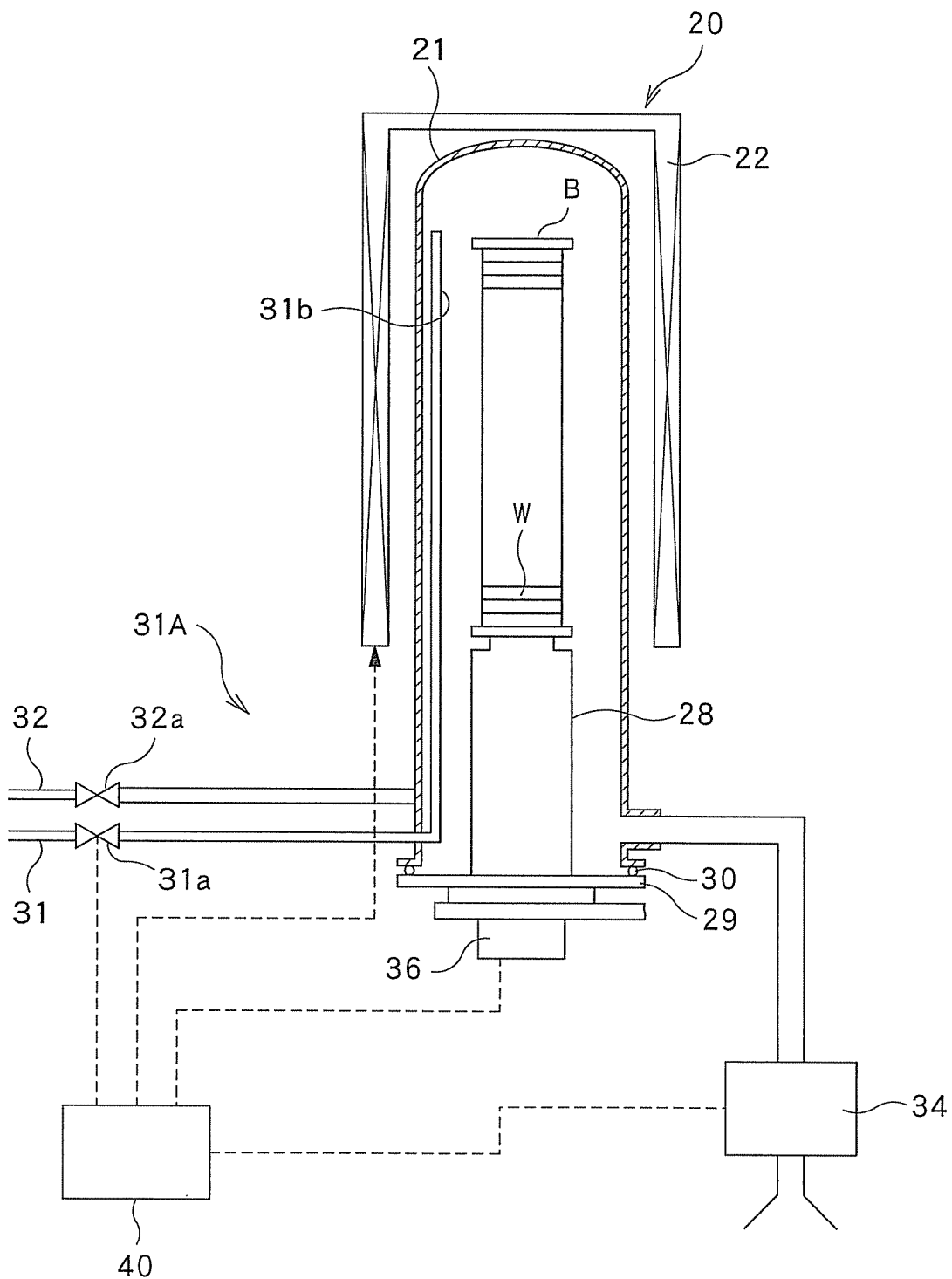
FIG. 8 is a diagram illustrating a vertical thermal processing apparatus to which the substrate processing apparatus according to an embodiment of the present invention is applied.

As shown in FIG. 8, the vertical thermal processing apparatus 20 includes a heater 22 that is a heating unit, and a reaction vessel (substrate processing chamber) 21 disposed in the heater 22 that thermally processes a processing target substrate (wafer). An opening in the lower end of the reaction vessel 21 is hermetically closed by a cover 29 through an O-ring 30. A boat B is disposed on the cover 29 through a thermal insulation cylinder 28. The thermal insulation cylinder 28 supports the boat B. The boat B is inserted into the reaction vessel 21. A plurality of wafers W to be batch-processed are maintained in a horizontal position and stacked on the boat B in the tube axis direction. The heater 22 heats the wafers W inserted into the reaction vessel 21 to a predetermined temperature.

A gas supply pipe 31, in which a control valve 31a is mounted, is installed to supply a plurality of types of gases, for example, an A gas and a B gas, to the reaction vessel 21.

The gas supply pipe 31 is extended into the reaction vessel 21 so that a gas is supplied to the wafers W disposed in the reaction vessel 21 through a gas supply hole 31b formed at a leading end of the gas supply pipe 31.

In this instance, the gas supply pipe 31, the control valve 31a, and the gas supply hole 31b form a process gas supply section 31A.

The reaction vessel 21 is connected to a vacuum pump 34. The boat B inserted into the reaction vessel 21 is rotationally driven by a boat rotation mechanism 36.

The control valve 31a in the gas supply pipe 31, the boat rotation mechanism 36, and the heater 22 are controlled by a control device 40 which is later described.

In addition to the A gas and the B gas, a purge gas is also supplied into the reaction vessel 21 through a gas supply pipe that has the same structure as the gas supply pipe 31.

Figure 9:
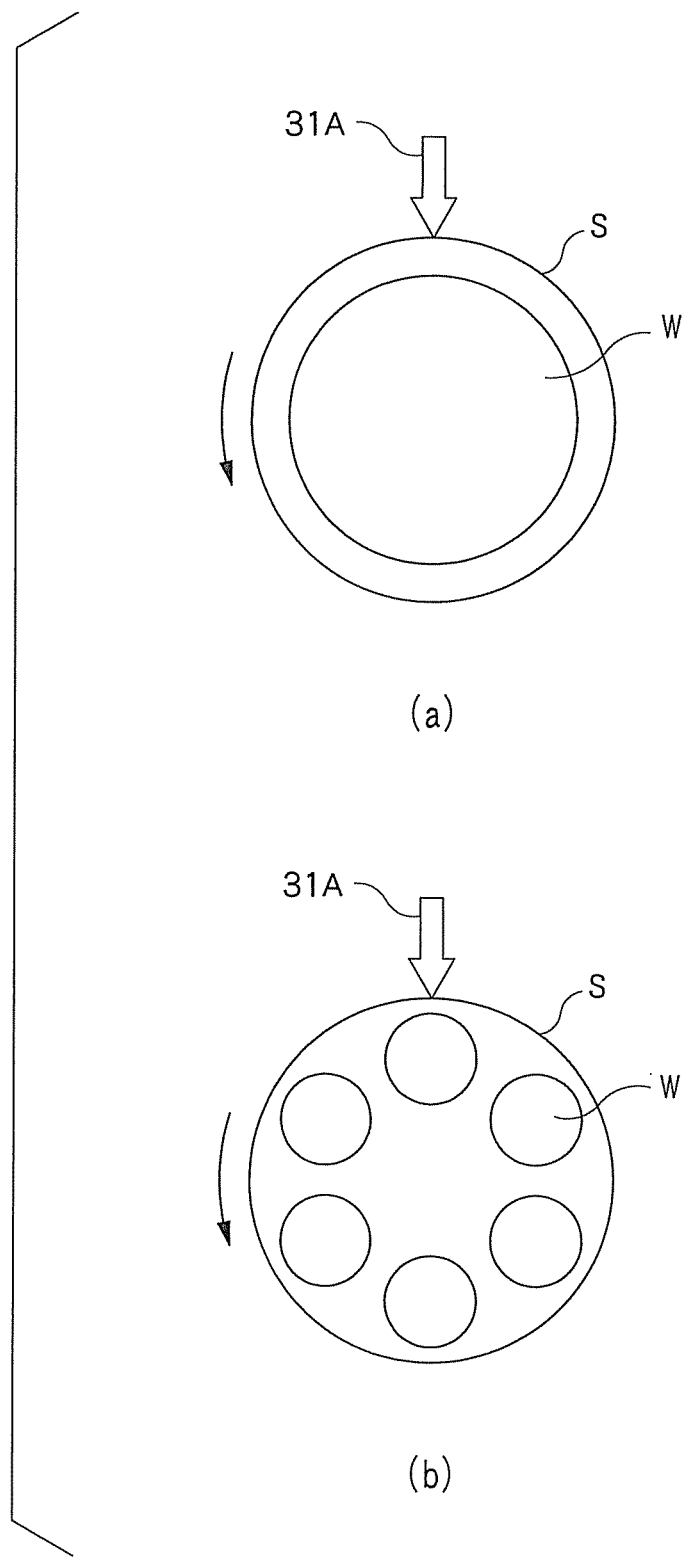
FIGS. 9(a) and 9(b) are diagrams illustrating an example modification of the substrate processing apparatus.

As described above, the substrate processing apparatus according to the embodiment of the present invention can be applied to the vertical thermal processing apparatus 20 shown in FIG. 8. However, the substrate processing apparatus can also be applied to a substrate processing apparatus in which one wafer W is placed on a susceptor S (FIG. 9(a)) and to a substrate processing apparatus in which a plurality of wafers W are placed on the susceptor S (FIG. 9(b)).

Although the present embodiment uses the boat rotation mechanism 36 as a substrate rotation mechanism, the substrate rotation mechanism is not limited to such a boat rotation mechanism. An alternative is to use a substrate rotation mechanism (not shown) that rotates the susceptor S on which one wafer W is placed or rotates the susceptor S on which a plurality of wafers W are placed (FIGS. 9(a) and 9(b)).

A pair of process gas supply sections 31A, 32A may be disposed to face the outer circumference of the wafers W in the substrate processing chamber 21 to supply the process gas to the wafers W. In this instance, the process gas supply sections 31A, 32A supply different gases, namely, the A gas and the B gas, respectively (solid line and two-dot chain line in FIG. 1).

Alternatively, a pair of process gas supply sections 31A, 32A may be disposed to face the outer circumference of the wafers W. In this instance, the process gas supply section 31A may supply the A gas while the process gas supply section 32A supplies the B gas that is different from the A gas. Another alternative is to make the pair of process gas supply sections 31A, 32A supply the same gas, namely, the A gas.

Figure 1:
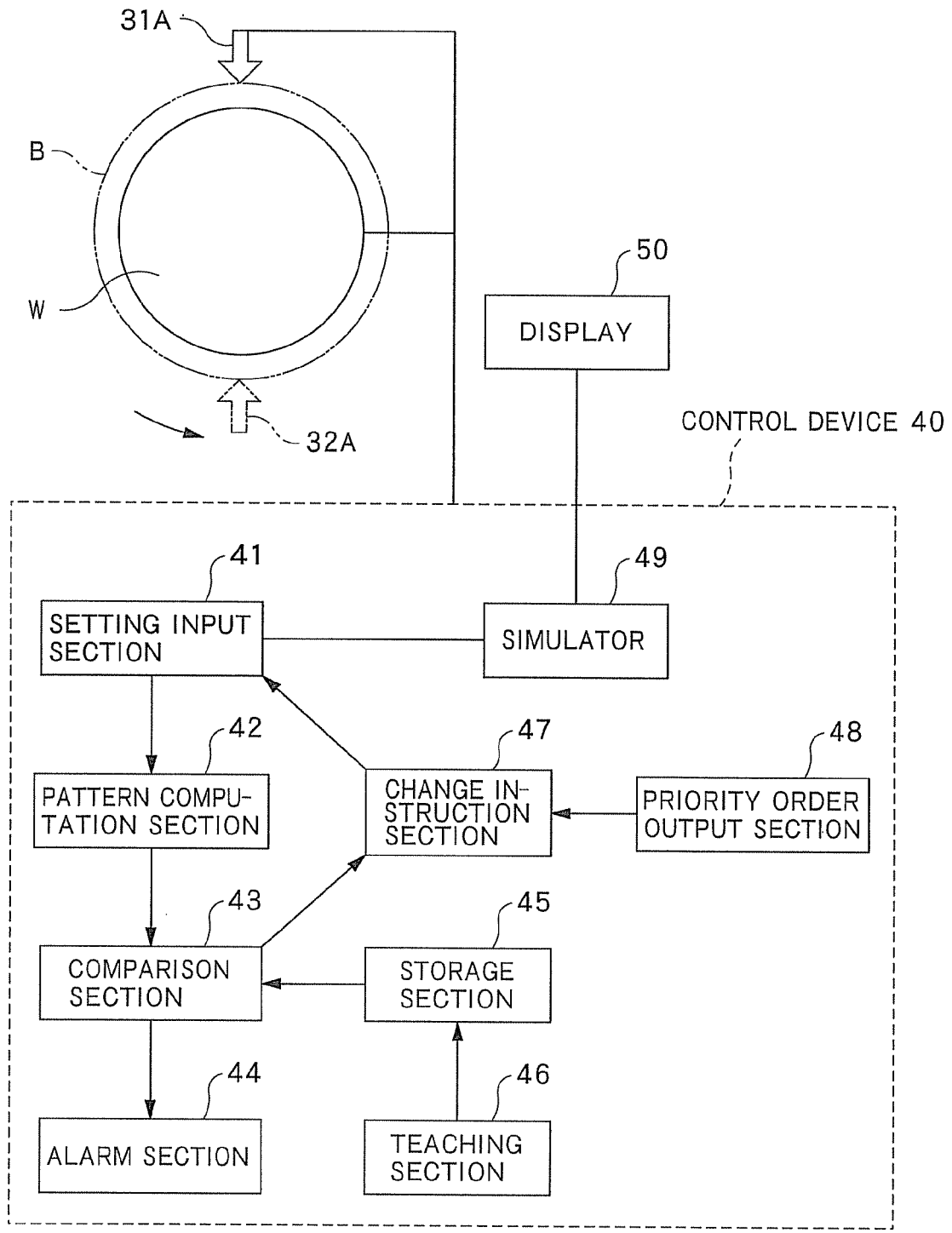
FIG. 1 is a diagram illustrating a substrate processing apparatus according to an embodiment of the present invention.

As shown in FIG. 1, the control device 40 includes a setting input section 41, a pattern computation section 42, a storage section 45, a comparison section 43, and an alarm section 44. The setting input section 41 inputs a rotation speed setting P for the substrate rotation mechanism, a supply cycle setting Q for the process gas including the A gas and B gas to be supplied from the process gas supply sections 31A, 32A, a supply time setting R for the process gas, and a supply count setting S for the process gas. In accordance with information provided from the setting input section, the pattern computation section 42 obtains the result of computation of a process gas supply cycle pattern that includes the rotation cycle of the substrate rotation mechanism and the supply cycle of the process gas. The storage section 45 stores the result of referencing of a process gas supply cycle pattern that adversely affects the result of processing. The comparison section 43 compares the result of computation of the process gas supply cycle pattern determined by the pattern computation section 42 with the result of referencing of the process gas supply cycle pattern from the storage section 45. The alarm section 44 issues an alarm when the comparison section 43 concludes that the result of computation of the process gas supply cycle pattern agrees with the result of referencing of the process gas supply cycle pattern. The use of the above-described configuration makes it possible to detect a problem before actual processing.

Further, when the comparison section 43 concludes that the result of computation of the process gas supply cycle pattern agrees with the result of referencing of the process gas supply cycle pattern, a change instruction section 47 instructs the setting input section 41 to change the rotation speed setting P, the supply cycle setting Q, the supply time setting R, or the supply count setting S. This makes it possible to automatically avoid a problem.

When a new process gas supply cycle pattern emerges to adversely affect the result of processing, a teaching section 46 adds the new process gas supply cycle pattern to the result of referencing of the process gas supply cycle pattern that is stored in the storage section 45.

The control device 40 further includes a priority order output section 48 that outputs information to the change instruction section 47 to specify which one of the rotation speed setting P, the supply cycle setting Q, the supply time setting R, and the supply count setting S is to be preferentially changed. The priority order output section 48 instructs the change instruction section 47 to preferentially change the rotation speed setting P or the supply cycle setting Q.

The present embodiment, which is configured as described above, will now be described in operation.

First, the setting input section 41 in the control device 40 shown in FIG. 1 inputs the rotation speed setting P for the substrate rotation mechanism, the supply cycle setting Q for the process gas to be supplied from the process gas supply section 31A or the process gas supply section 32A, the supply time setting R for the process gas, and the supply count setting S for the process gas.

In the above instance, the supply cycle setting Q, supply time setting R, and supply count setting S for the process gas are prepared and set beforehand by a recipe creation section.

Next, in accordance with information provided from the setting input section 41, the pattern computation section 42 obtains the result of computation P1 of a process gas supply cycle pattern that includes the rotation cycle of the substrate rotation mechanism and the supply cycle, supply time, and supply count of the process gas.

Figure 2:
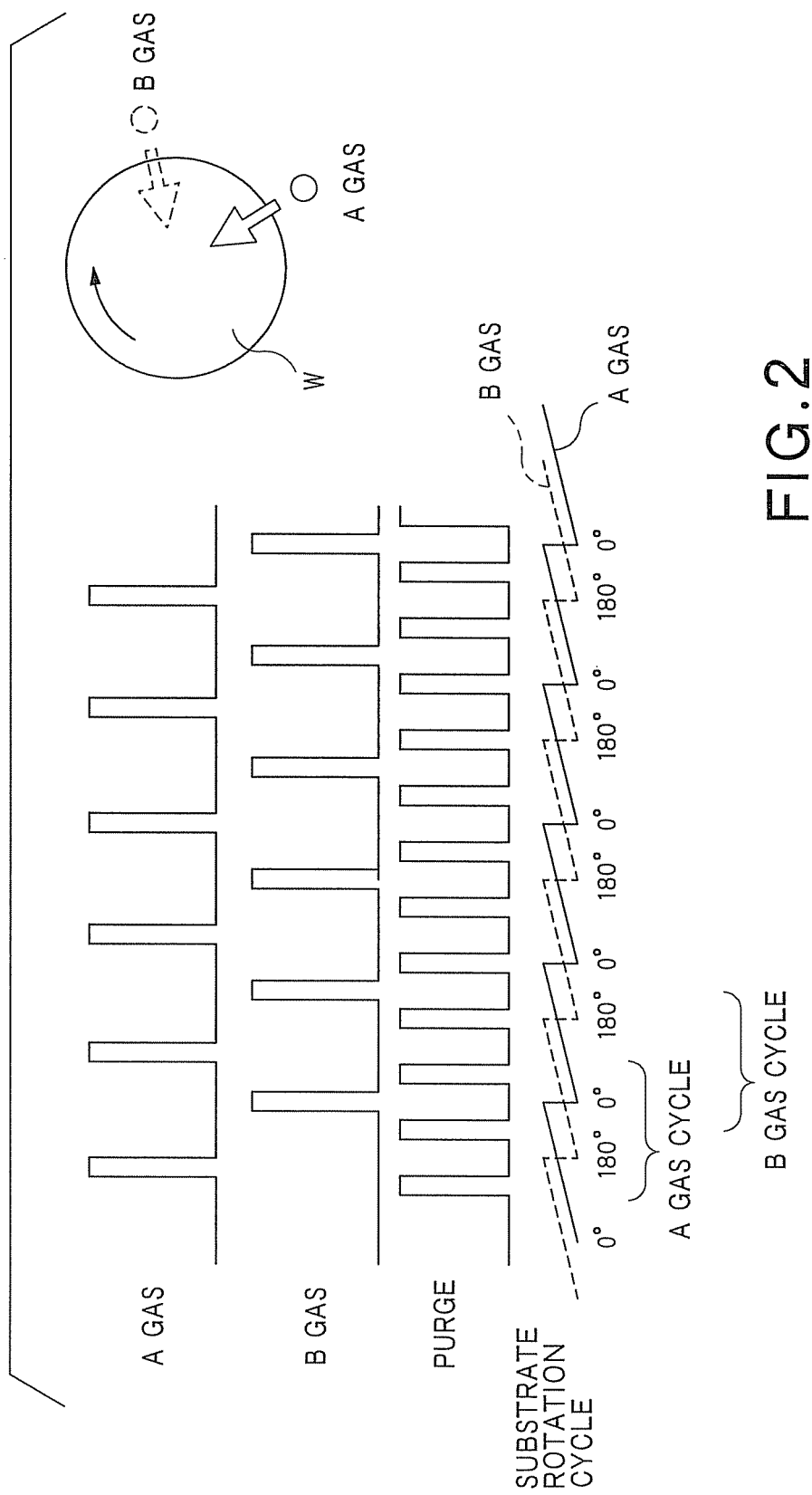
FIG. 2 is a diagram illustrating a process gas supply cycle pattern including the rotation cycle of a processing target substrate, and the supply cycle, supply time, and supply count of a process gas.

FIG. 2 is a diagram illustrating the result of computation P1 of the process gas supply cycle pattern, which is derived from the computation performed by the pattern computation section 42. FIG. 2 indicates that the supply cycles of the A gas and B gas do not agree with the rotation cycle of the wafers W. To supply the A gas and B gas uniformly onto the wafers W, it is necessary to rotate the wafers W at least five turns.

The storage section 45 stores beforehand the result of referencing of a process gas supply cycle pattern that adversely affects the result of wafer processing by the substrate processing apparatus.

Further, if any problem arises, for instance, with in-plane uniformity when the wafers W are thermally processed in accordance with a certain process gas supply cycle pattern including the rotation cycle of the substrate rotation mechanism and the supply cycle, supply time, and supply count of the process gas, the process gas supply cycle pattern that has caused the problem is newly stored in the storage section 45 as a result of referencing.

Next, the comparison section 43 compares the result of computation P1 of the process gas supply cycle pattern, which is derived from the computation performed by the pattern computation section 42, with the result of referencing of the process gas supply cycle pattern from the storage section 45. If the comparison section 43 concludes that the result of computation P1 of the process gas supply cycle pattern agrees with the result of referencing of the process gas supply cycle pattern, the alarm section 44 issues an alarm because it is judged that the same problem occurs when the wafers W are thermally processed in accordance with the result of computation of the process gas supply cycle pattern.

Further, if the comparison section 43 concludes that the result of computation P1 of the process gas supply cycle pattern agrees with the result of referencing of the process gas supply cycle pattern, the change instruction section 47 instructs the setting input section 41 to change the rotation speed setting P, the supply cycle setting Q, the supply time setting R, or the supply count setting S.

In the above instance, the priority order output section 48 outputs information to the change instruction section 47 to specify which one of the rotation speed setting P, the supply cycle setting Q, the supply time setting R, and the supply count setting S is to be preferentially changed.

In accordance with the information provided from the setting input section 41, a simulator 49 included in the control device 40 simulates the shape of a supply region of the process gas to be supplied onto the wafers W, and then a display 50 displays the result of the simulation.

The shape of a supply region of the process gas to be supplied onto the wafers W, which is determined by the simulator 49 included in the control device 40, will now be described with reference to FIGS. 3 to 7.

Figure 3:
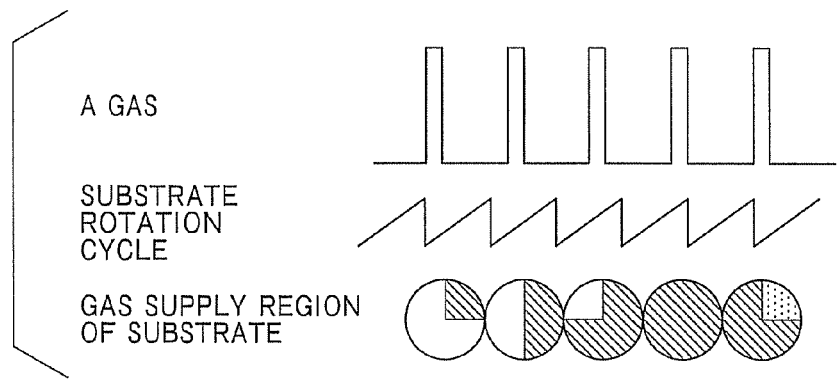
FIG. 3 is a diagram illustrating the supply region, supply cycle, supply time, and supply count of the process gas supplied to the processing target substrate, and a rotation state of the substrate.
Figure 4:
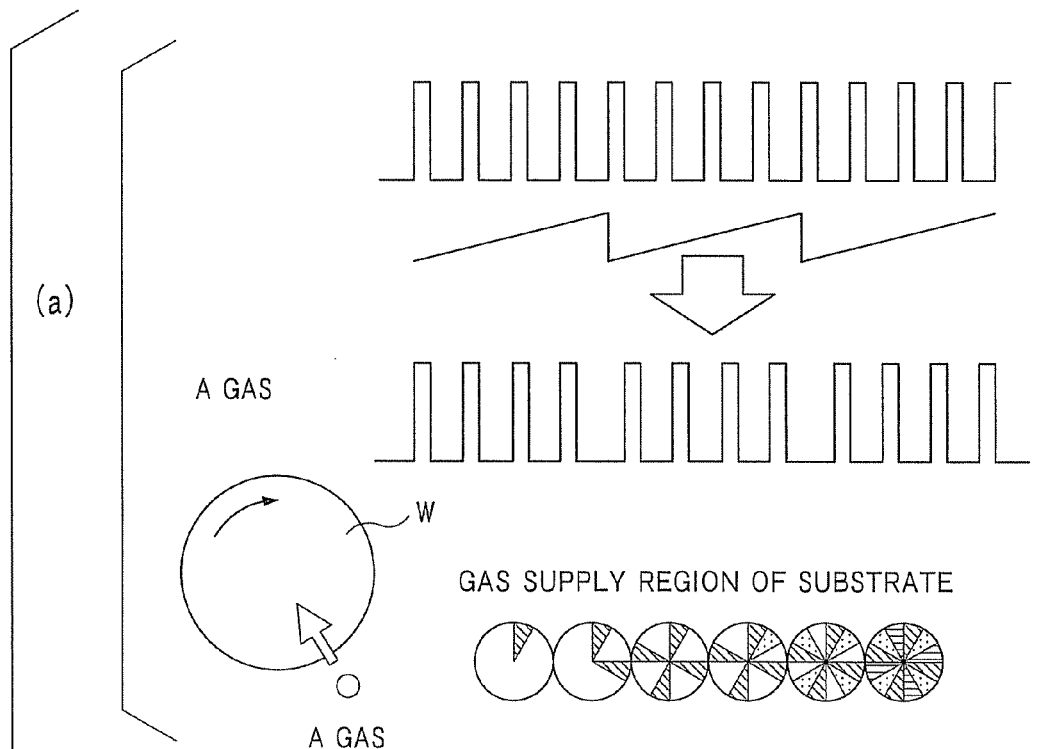
FIGS. 4(a) and 4(b) are diagrams illustrating the supply region, supply cycle, supply time, and supply count of the process gas supplied to the processing target substrate, and the rotation state of the substrate.
Figure 4:
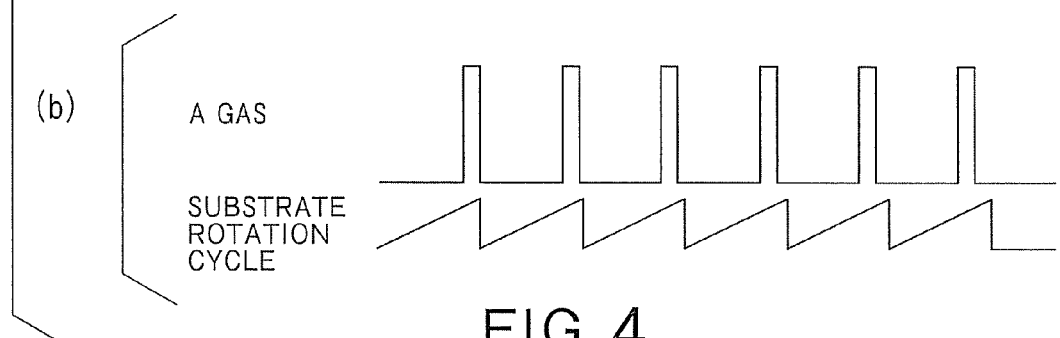

First, as shown in FIG. 3, the A gas is supplied to a wafer W at a supply time setting of 15 seconds and at a supply cycle setting of 60 seconds while the wafer W is rotated one turn every 60 seconds. In this instance, the wafer W is rotated four turns to supply the A gas to its entire surface.

Further, as shown in FIG. 4(a), the A gas is supplied to the wafer W at a supply time setting of 5 seconds and at a supply cycle setting of 10 seconds while the wafer W is rotated one turn every 60 seconds. When the A gas is supplied to the wafer W at a supply time setting of 5 seconds and at a supply cycle setting of 10 seconds while the wafer W is rotated one turn every 60 seconds, the positions of A gas supply on the wafer W coincide with each other. Therefore, the timing of A gas supply is periodically changed to vary the A gas supply position.

Further, as shown in FIG. 4(b), the A gas is supplied to the wafer W at a supply time setting of 5 seconds and at a supply cycle setting of 56 seconds while the wafer W is rotated one turn every 60 seconds. If a supply count setting of 30 is employed in this instance, the alarm section 44 issues an alarm because the A gas cannot be supplied to the entire surface of the wafer W. Alternatively, the setting input section 41 increases the supply count setting to 60, selects a supply time setting of 6 seconds, or changes the rotation speed setting to 2 turns/60 seconds in accordance with a signal from the change instruction section 47. These setting changes are selected by the priority order output section 46.

The A gas can be supplied to the entire surface of the wafer W in the manner described above.

Figure 5:
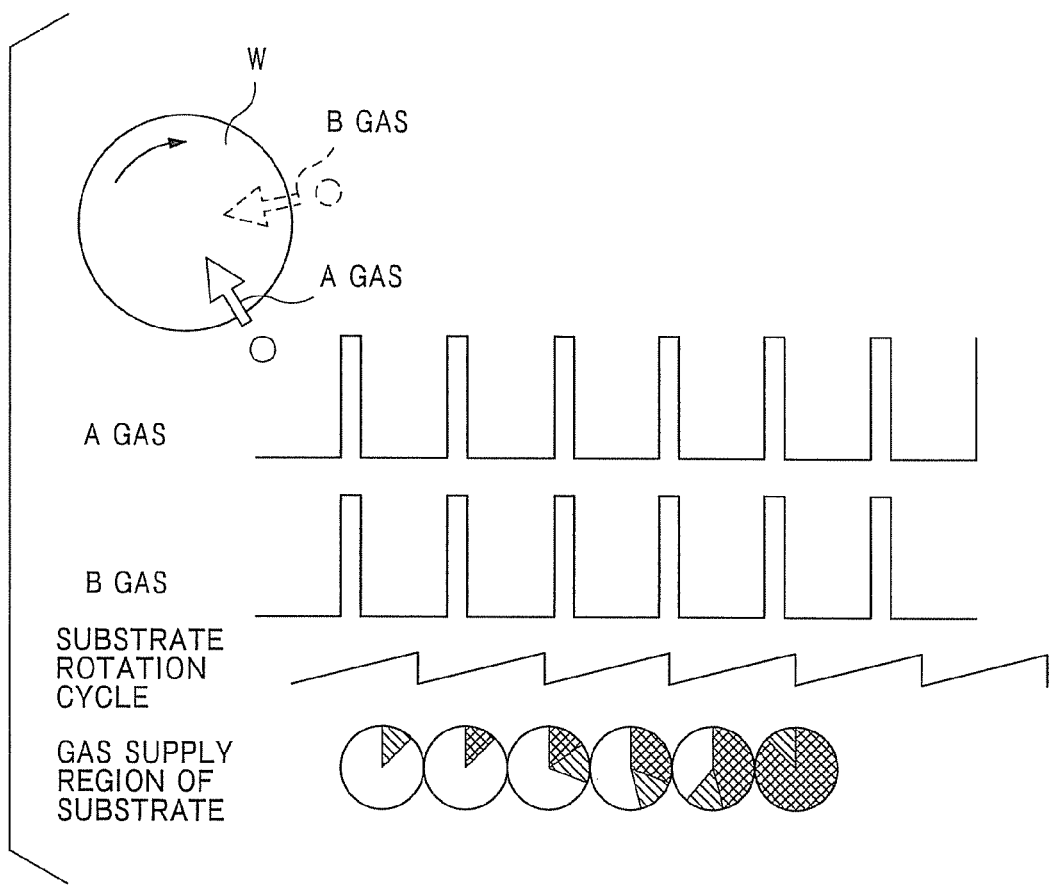
FIG. 5 is a diagram illustrating the supply region, supply cycle, supply time, and supply count of the process gas supplied to the processing target substrate, and the rotation state of the substrate.
Figure 6:
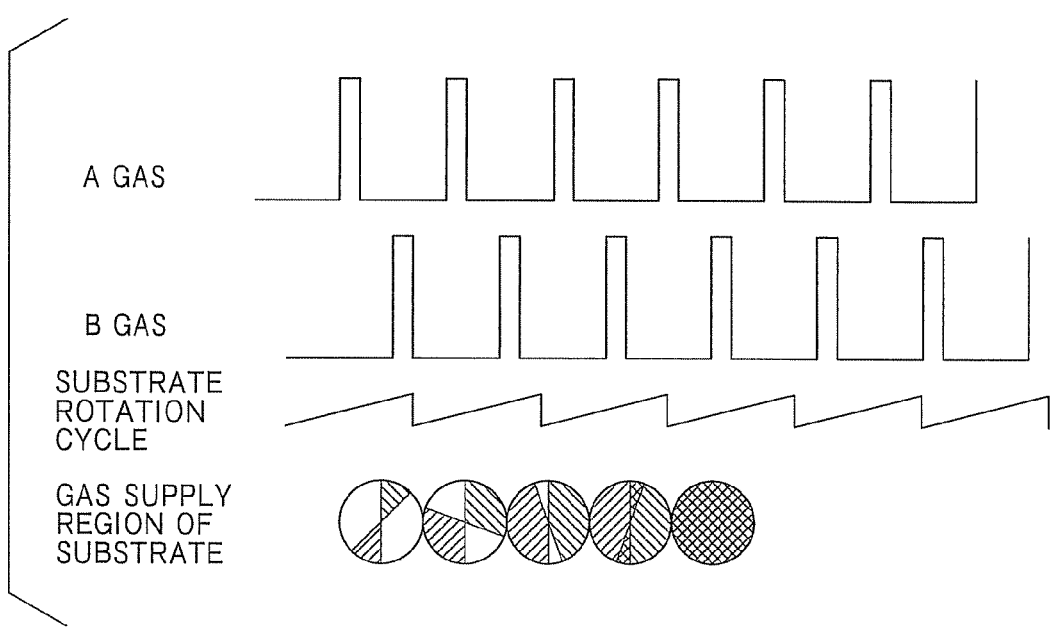
FIG. 6 is a diagram illustrating the supply region, supply cycle, supply time, and supply count of the process gas supplied to the processing target substrate, and the rotation state of the substrate.
Figure 7:
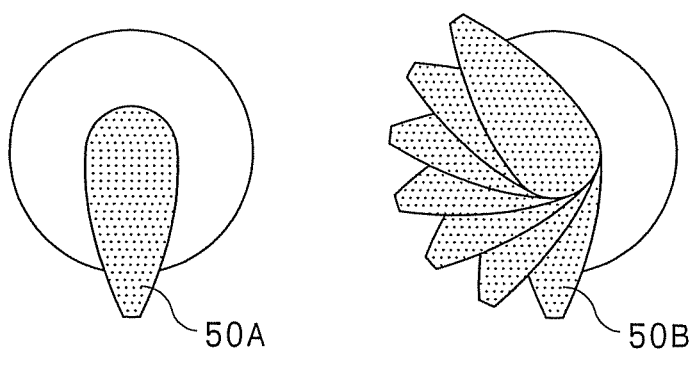
FIGS. 7(a) and 7(b) are diagrams illustrating the shape of a supply region of the process gas supplied onto the processing target substrate.

Furthermore, as shown in FIG. 5, the A gas and the B gas can be supplied to the same positions of the wafer W. Moreover, as shown in FIG. 6, the A gas and the B gas can be supplied to opposing positions of the wafer W that are 180 degrees apart from each other.

In addition, as shown in FIGS. 7(a) and 7(b), the simulator 49 predetermines the shape 50A of an injection of the A gas that is injected onto the wafer W from the process gas supply section 31A (FIG. 7(a)), and then determines the shape 50B of a region of A gas supply onto the wafer W from the supply count setting S (FIG. 7(b)). The shape 50A of the A gas injection and the shape 50B of the A gas supply region are displayed on the display 50.

According to the present embodiment described above, the comparison section 43 compares the result of computation of the process gas supply cycle pattern determined by the pattern computation section 42 with the result of referencing of a process gas supply cycle pattern that adversely affects the result of processing and is obtained from the storage section 45. The alarm section 44 issues an alarm if the comparison section 43 concludes that the result of computation of the process gas supply cycle pattern agrees with the result of referencing of the process gas supply cycle pattern. This makes it possible to change beforehand a process gas supply cycle pattern that will adversely affect the result of processing. Consequently, the substrate can be properly processed to provide improved in-plane uniformity.

What is claimed is:

1. A substrate processing apparatus comprising:
a substrate processing chamber that houses and processes at least one substrate having an upper surface;
a substrate rotation mechanism that rotatably retains the substrate in the substrate processing chamber;
a process gas supply section comprising at least two gas supply devices having a plurality of gas supply ports, at least one of said gas supply ports positioned parallel to and spaced from a periphery of the substrate so that the processing gas supply section supplies intermittently a process gas in a direction substantially parallel to the upper surface of the substrate from the periphery thereof in the substrate processing chamber; and
a control device that controls the substrate rotation mechanism and the process gas supply section,
wherein the control device is configured to include:
a setting input section that inputs a rotation speed setting P for the substrate rotation mechanism, a supply cycle setting Q, a supply time setting R, and a supply count setting S for the process gas to be supplied from the process gas supply section, and
a pattern computation section that, in accordance with information supplied from the setting input section, obtains the result of computation of a process gas supply cycle pattern that includes a rotation cycle of the substrate rotation mechanism, and a supply cycle, a supply time, and a supply count of the process gas so as to supply the process gas to all of a periphery of the substrate, and
wherein the process gas supply section includes at least two process gas supply devices, and a process gas supply device supplies one process gas from one side of the periphery of the substrate, and another process gas supply device supplies a different process gas from an opposite side of the periphery of the substrate.

2. The substrate processing apparatus according to claim 1, wherein the control device further includes a simulator that, in accordance with the information supplied from the setting input section, simulates the shape of a supply region of the process gas to be supplied onto the substrate, and the result of the simulation performed by the simulator is displayed on a display.

3. The substrate processing apparatus according to claim 1, wherein the substrate rotation mechanism rotates a susceptor on which one substrate is placed.

4. The substrate processing apparatus according to claim 1, wherein the substrate rotation mechanism rotates a susceptor on which a plurality of substrates are placed.

5. The substrate processing apparatus according to claim 1, wherein the substrate rotation mechanism includes a boat rotation mechanism that rotates a boat in which a plurality of substrates are placed.

6. The substrate processing apparatus according to claim 1, wherein the process gas supply section includes at least two process gas supply devices that are disposed apart from the outer circumference of the substrate retained by the substrate rotation mechanism.

7. A control device for use with a substrate processing apparatus that includes a substrate processing chamber for housing and processing at least one substrate, a substrate rotation mechanism for rotatably retaining the substrate in the substrate processing chamber, and a process gas supply section for supplying intermittently a process gas to the substrate from at least two gas supply devices positioned parallel to and spaced from a periphery of the substrate in the substrate processing chamber, the control device configured to include:

a setting input section that inputs a rotation speed setting P for the substrate rotation mechanism, and a supply cycle setting Q, a supply time setting R, and a supply count setting S for the process gas to be supplied from the process gas supply section; and a pattern computation section that, in accordance with information supplied from the setting input section, obtains the result of computation of a process gas supply cycle pattern that includes a rotation cycle of the substrate rotation mechanism, and a supply cycle, a supply time, and a supply count of the process gas so that the intermittently supplied process gas supplied from the at least two gas supply devices in a direction substantially parallel to an upper surface of the substrate is supplied to all of the periphery of the substrate, wherein one process gas supply device supplies one process gas from one side of the periphery of the substrate, and another process gas supply device supplies a different process gas from an opposite side of the periphery of the substrate.

8. The control device according to claim 7, further comprising:

a simulator that, in accordance with the information supplied from the setting input section, simulates the shape of a supply region of the process gas to be supplied onto the substrate.

9. A control method for controlling the substrate processing apparatus according to claim 1, the control method comprising the steps of:

causing a setting input section to input a rotation speed setting P for a substrate rotation mechanism, and a supply cycle setting Q, a supply time setting R, and a supply count setting S for a process gas to be supplied intermittently from at least two gas supply devices positioned parallel to and spaced from a periphery of the substrate of a process gas supply section; and, in accordance with information supplied from the setting input section, causing a pattern computation section to compute a process gas supply cycle pattern that includes a rotation cycle of the substrate rotation mechanism, and a supply cycle, a supply time, and a supply count of the process gas so that the intermittently supplied process gas supplied from the at least two gas supply devices in a direction substantially parallel to an upper surface of the substrate is supplied to all of the periphery of the substrate, wherein one process gas supply device supplies one process gas from one side of the periphery of the substrate, and another process gas supply device supplies a different process gas from an opposite side of the periphery of the substrate.

10. The control method for the substrate processing apparatus according to claim 9, further comprising the steps of:

causing a simulator to simulate the shape of a supply region of the process gas to be supplied onto a substrate, and displaying the result of the simulation on a display.

11. The substrate processing apparatus according to claim 1, wherein a storage section that stores the result of referencing of a process gas supply cycle pattern that adversely affects the result of processing; a comparison section that compares the result of computation of the process gas supply cycle pattern determined by the pattern computation section with the result of referencing of the process gas supply cycle pattern from the storage section; and an alarm section that issues an alarm when the comparison section concludes that the result of computation of the process gas supply cycle agrees with the result of referencing of the process gas supply cycle pattern.

12. The substrate processing apparatus according to claim 11, wherein a change instruction section that instructs the setting input section to change the rotation speed setting P, the supply cycle setting Q, the supply time setting R, and the supply count setting S when a comparison section concludes that the result of computation of the process gas supply cycle pattern agrees with the result of referencing of a process gas supply cycle pattern that adversely affects the result of processing; a teaching section that, when a new process gas supply cycle pattern emerges to adversely affect the result of processing, adds the new process gas supply cycle pattern to the result of referencing of the process gas supply cycle pattern stored in the storage section; and a priority order output section that outputs information to the change instruction section to specify which one of the rotation speed setting P, the supply cycle setting Q, the supply time setting R, and the supply count setting S is to be preferentially changed.

13. The substrate processing apparatus according to claim 12, wherein the priority order output section outputs information to the change instruction section so as to preferentially change the rotation speed setting P or the supply cycle setting Q.

* * * * *